United States Patent
Larson et al.

(10) Patent No.: US 11,089,688 B2
(45) Date of Patent: Aug. 10, 2021

(54) SENSOR DEVICE HAVING PRINTED CIRCUIT BOARD SUBSTRATE WITH BUILT-IN MEDIA CHANNEL

(71) Applicant: TT Electronics PLC, Carrollton, TX (US)

(72) Inventors: Brent Hans Larson, Dallas, TX (US); Shivesh Langhanoja, Flower Mound, TX (US)

(73) Assignee: TT ELECTRONICS PLC, Carrollton, TX (US)

( * ) Notice: Subject to any disclaimer, the term of this patent is extended or adjusted under 35 U.S.C. 154(b) by 280 days.

(21) Appl. No.: 16/397,594

(22) Filed: Apr. 29, 2019

(65) Prior Publication Data

US 2019/0254168 A1   Aug. 15, 2019

Related U.S. Application Data

(62) Division of application No. 15/605,353, filed on May 25, 2017, now Pat. No. 10,285,275.

(51) Int. Cl.
*H05K 1/18*     (2006.01)
*H05K 1/02*     (2006.01)
(Continued)

(52) U.S. Cl.
CPC .......... *H05K 1/185* (2013.01); *G01L 19/0007* (2013.01); *G01L 19/0076* (2013.01); *G01L 19/148* (2013.01); *H05K 1/0272* (2013.01); *H05K 1/09* (2013.01); *H05K 1/111* (2013.01); *H05K 1/115* (2013.01); *H05K 3/28* (2013.01); *H05K 3/32* (2013.01); *G01L 13/025* (2013.01); *H05K 1/16* (2013.01); *H05K 1/18* (2013.01); *H05K 1/181* (2013.01); *H05K 7/02* (2013.01); *H05K 2201/037* (2013.01);
(Continued)

(58) Field of Classification Search
CPC ............ H05K 1/16; H05K 1/18; H05K 1/181; H05K 1/182; H05K 1/183; H05K 1/185; H05K 1/186
USPC ......................................... 361/760–767, 783
See application file for complete search history.

(56) References Cited

U.S. PATENT DOCUMENTS 6,432,737 B1   8/2002 Sonoda
6,927,482 B1   8/2005 Kim et al.
(Continued)

FOREIGN PATENT DOCUMENTS

TW     201316855 A    4/2013

OTHER PUBLICATIONS

Taiwanese Patent Office (TIPLO), First Office Action with Translation for Taiwanese Patent Application No. 107117714, dated Nov. 27, 2018, 7 pages.
(Continued)

*Primary Examiner* — Binh B Tran
(74) *Attorney, Agent, or Firm* — Haynes and Boone, LLP

(57) ABSTRACT

A sensor device includes a printed circuit board (PCB) substrate having a top surface, a bottom surface, a slot between the top and bottom surfaces, and two holes through the top surface and reaching into the slot. The sensor device further includes a sensor chip mounted on the top surface of the PCB substrate and above one of the two holes. The sensor device further includes a molding compound covering the sensor chip and sidewall surfaces and the top surface of the PCB substrate.

20 Claims, 6 Drawing Sheets

(51) Int. Cl.

| | | |
|---|---|---|
| *G01L 19/14* | (2006.01) | |
| *G01L 19/00* | (2006.01) | |
| *H05K 1/09* | (2006.01) | |
| *H05K 1/11* | (2006.01) | |
| *H05K 3/28* | (2006.01) | |
| *H05K 3/32* | (2006.01) | |
| *H05K 7/02* | (2006.01) | |
| *H05K 1/16* | (2006.01) | |
| *G01L 13/02* | (2006.01) | |

(52) U.S. Cl.
CPC ............ *H05K 2201/10* (2013.01); *H05K 2201/10151* (2013.01); *H05K 2203/1327* (2013.01); *H05K 2203/308* (2013.01)

(56) References Cited

U.S. PATENT DOCUMENTS

| | | | |
|---|---|---|---|
| 7,089,799 | B2 | 8/2006 | Nomua et al. |
| 7,282,786 | B2 | 10/2007 | Jung et al. |
| 7,560,811 | B2 | 7/2009 | Sakakibara |
| 7,781,852 | B1 | 8/2010 | Faheem et al. |
| 7,994,618 | B2 | 8/2011 | Deke et al. |
| 8,234,926 | B2 | 8/2012 | Wohl et al. |
| 8,378,435 | B2 | 2/2013 | Lo et al. |
| 8,587,956 | B2 * | 11/2013 | Choutov ............ H05B 45/37 361/763 |
| 9,061,888 | B2 | 6/2015 | Pahl et al. |
| 9,297,713 | B2 | 3/2016 | Lo et al. |
| 9,362,479 | B2 | 6/2016 | Lo |
| 2008/0229840 | A1 | 9/2008 | Shirasaka et al. |
| 2009/0194831 | A1 | 8/2009 | Casey et al. |
| 2009/0266173 | A1 | 10/2009 | Kobayashi et al. |
| 2011/0016981 | A1 | 1/2011 | Gebauer et al. |
| 2011/0079085 | A1 | 4/2011 | Kanda et al. |
| 2011/0083513 | A1 | 4/2011 | Wohlgemuth et al. |
| 2011/0222253 | A1 * | 9/2011 | Chen ............ H01L 24/83 361/760 |
| 2012/0008294 | A1 | 1/2012 | Minoo et al. |
| 2015/0062837 | A1 | 3/2015 | Greiner et al. |
| 2015/0182966 | A1 | 7/2015 | Coursey et al. |
| 2018/0343745 | A1 | 11/2018 | Larson et al. |

OTHER PUBLICATIONS

Notification of Transmittal of the International Search Report and the Written Opinion of the International Searching Authority, or the Declaration (PCT/ISA/220), International Search Report (PCT/ISA/210), and the Written Opinion of the International Searching Authority (PCT/ISA/237), International application No. PCT/US2018/031192 dated Aug. 10, 2018, 17 pages.

Semi Pressure Sensors, "Amplified Analog Digital", http://www.si-micro.com/en/category/name/ampp-ana- digi/page/, dated Apr. 25, 2017, 2 pages.

MEMS Pressure Sensor, "Amphenol Advanced Sensors", http://www.amphenol-sensors.com/en/products/pressure-mems/mems-sensors/, Apr. 25, 2017, 2 pages.

Honeywell, SX SMT Series, "Microstructure Pressure Sensors 0 psi to 1 psi through 0 psi to 150 psi", Apr. 2008, 4 pages.

* cited by examiner

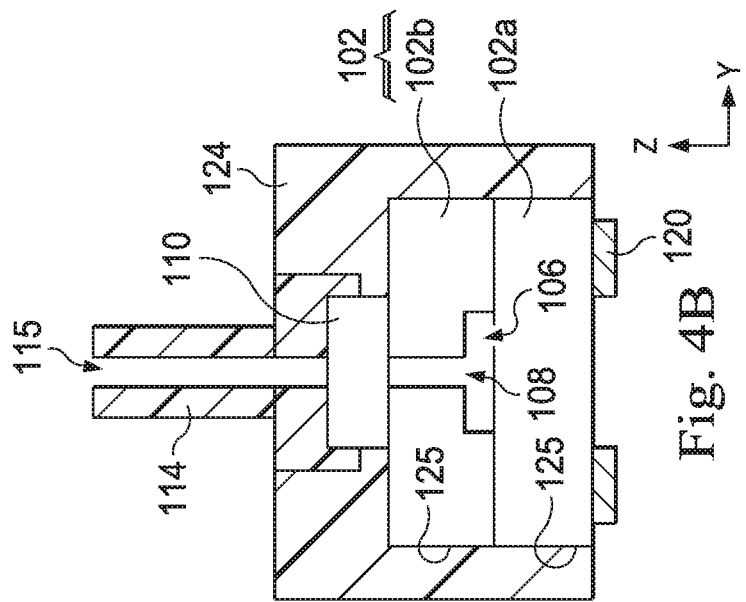
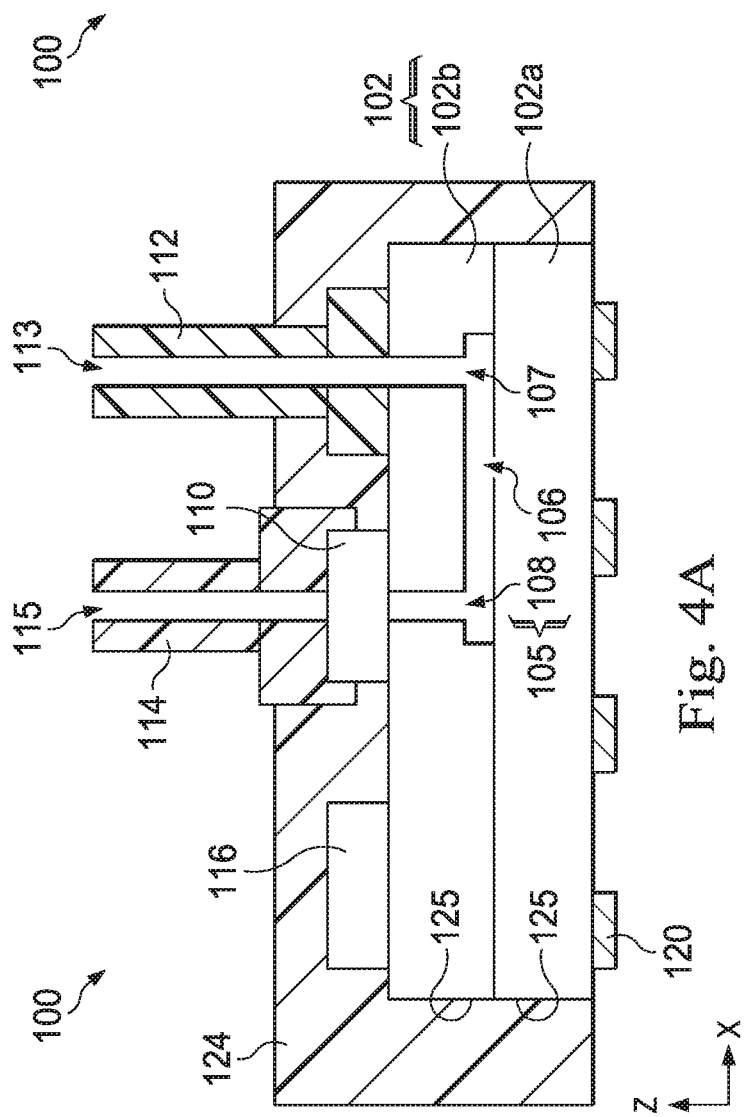
Fig. 4A
Fig. 4B

SENSOR DEVICE HAVING PRINTED CIRCUIT BOARD SUBSTRATE WITH BUILT-IN MEDIA CHANNEL

CROSS-REFERENCE TO RELATED APPLICATION

The present application is a Divisional of U.S. patent application Ser. No. 15/605,353, filed May 25, 2017, and entitled "Sensor Device Having Printed Circuit Board Substrate With Built-In Media Channel," the disclosure of which is incorporated by reference herein in its entirety.

BACKGROUND

Sensor devices, such as pressure sensor devices, are widely used in many applications. For example, pressure sensor devices can be used for monitoring tire pressure in automotive tires or for monitoring air pressure in an air filter system. Acoustic sensors can be used for detecting acoustic waves or sound. Optical sensors can be used for detecting light wave or light beam. In a typical application, one or more sensor devices are usually integrated with other components in a system. To reduce the size and the cost of the system, it is highly desirable to have the sensor device(s) in a small form factor, yet reliable, package. However, this task remains challenging. For example, some existing pressure sensor devices have a pressure sensor chip mounted on a substrate and covered with a plastic lid. An epoxy sealant is applied between the substrate and the plastic lid to hold pressure therein. Such solution is not completely satisfactory for a few reasons. For example, using epoxy sealant may lead to a higher manufacturing cost due to extended assembly time and increased process complexity. In addition, epoxy sealant may fail over time.

Accordingly, improvements in the packaging of sensor devices are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1A is a view taken along the A-A line in FIG. 1C. FIG. 1B is a view taken along the B-B line in FIG. 1C.

FIGS. 4A and 4B are schematic cross-sectional views of an example sensor device, constructed according to some aspects of the present disclosure.

DETAILED DESCRIPTION

Figure 1B:
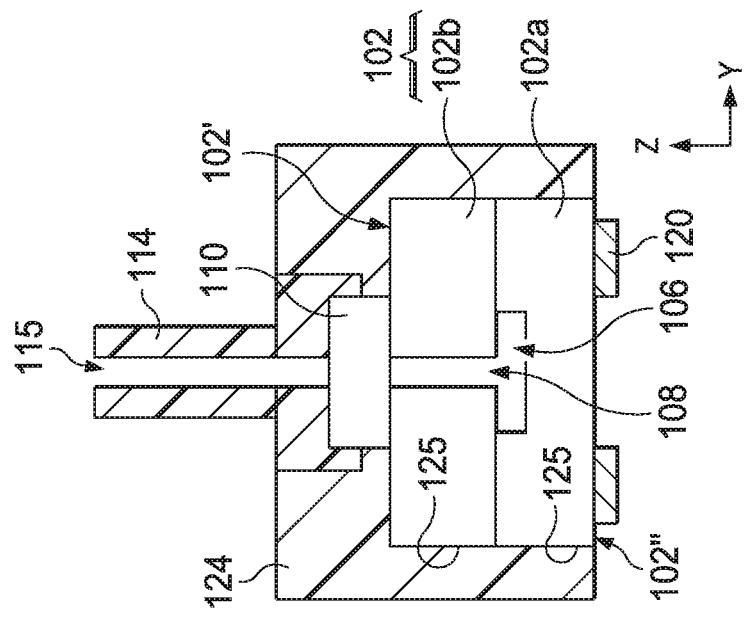
FIGS. 1A and 1B are schematic cross-sectional views of an example sensor device having a printed circuit board (PCB) substrate with a built-in media channel, constructed according to some aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. Any alterations and further modifications to the described devices, systems, methods, and any further application of the principles of the present disclosure are fully contemplated as would normally occur to one having ordinary skill in the art to which the disclosure relates. For example, the features, components, and/or steps described with respect to one embodiment may be combined with the features, components, and/or steps described with respect to other embodiments of the present disclosure to form yet another embodiment of a device, system, or method according to the present disclosure even though such a combination is not explicitly shown. Further, for the sake of simplicity, in some instances the same reference numerals are used throughout the drawings to refer to the same or like parts.

Further, spatially relative terms, such as "beneath," "below," "lower," "bottom," "above," "upper," "over," "on," "top," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to sensor devices and methods of making the same. More particularly, the present disclosure is related to assembling a sensor chip (or a sensor die) and other components (if any) with over-molding to create a small form factor package. In a preferred embodiment, a signal processing chip (or a signal processing die) is over-molded together with the sensor chip. According to embodiments of the present disclosure, the sensor chip and the other components are mounted onto a top surface of a printed circuit board (PCB) substrate which includes a built-in media channel. The media channel includes two holes through the top surface of the PCB substrate and a buried slot (e.g., a buried via) inside the PCB substrate. The two holes and the buried slot form a passageway for an application medium to pass there-through. The sensor chip is mounted above (e.g., directly above) one of the two holes, leaving its bottom surface accessible through the other one of the two holes for sensing purposes. The sensor chip, any other components, and the PCB substrate are over-molded to create a small form factor package. The over-molding not only protects the various components, but also provides mechanical strength and reliability to the sensor device. Compared with traditional sensor device packaging methods, the present disclosure provides a simpler manufacturing flow and produces a smaller and more reliable sensor device package.

Figure 1A:
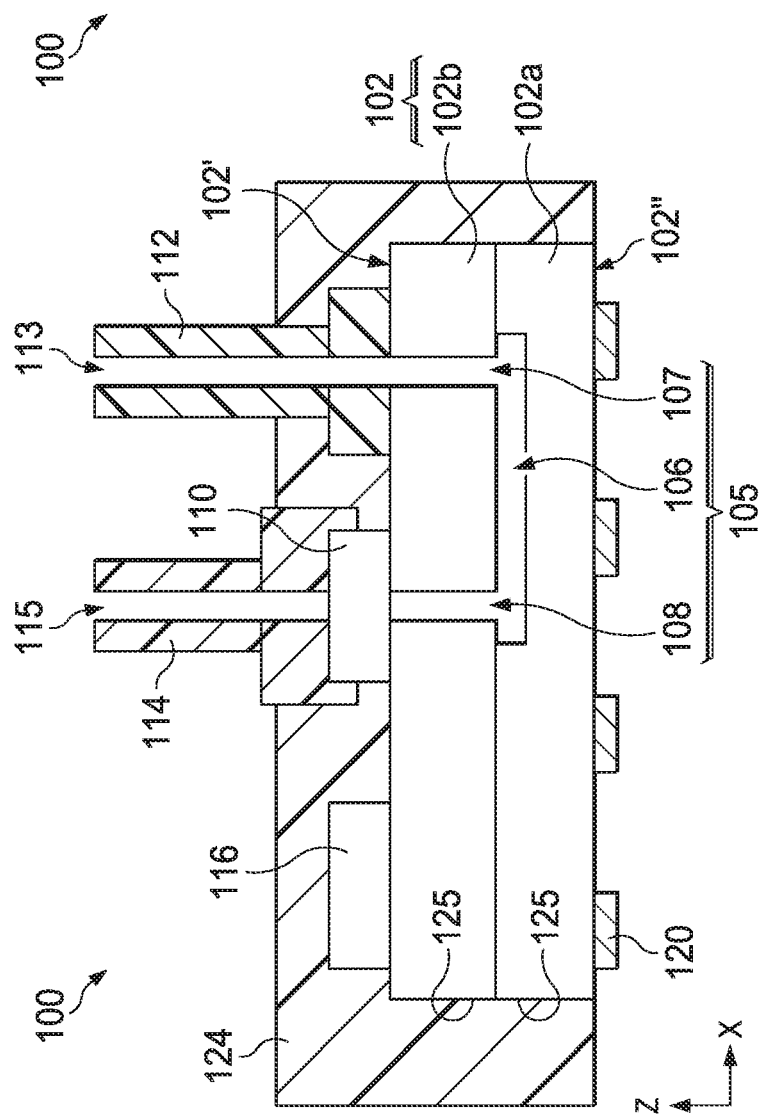
Figure 1C:
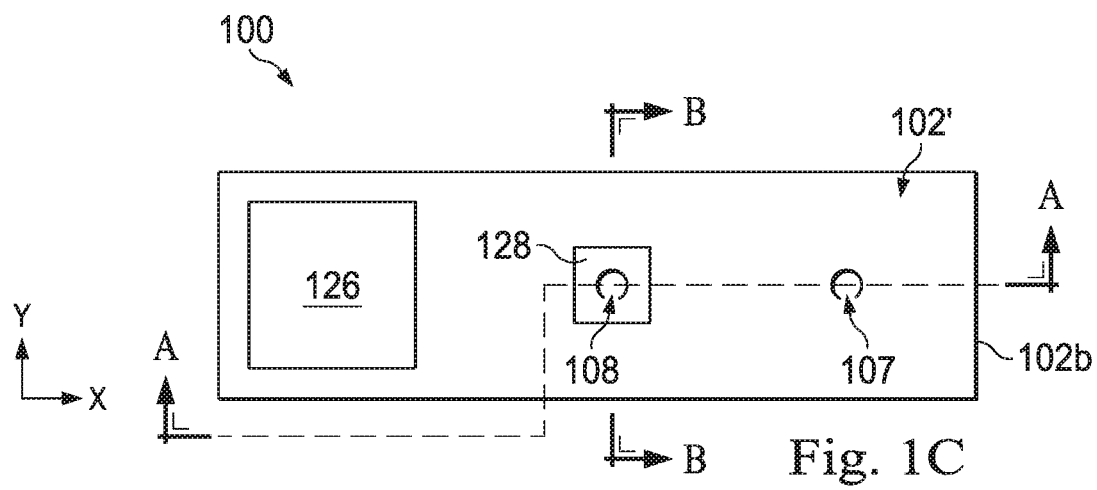
FIG. 1C is a schematic plan view of the top surface of the PCB substrate of FIGS. 1A and 1B, in accordance with some embodiments.
Figure 1D:
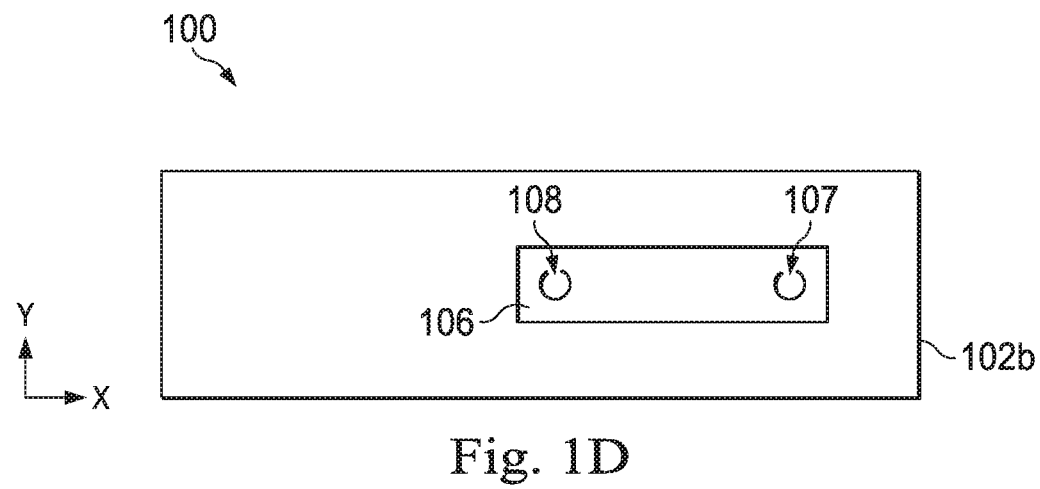
FIG. 1D is a schematic plan view of a bottom surface of an upper layer of the PCB substrate of FIGS. 1A and 1B, in accordance with some embodiments.
Figure 1E:
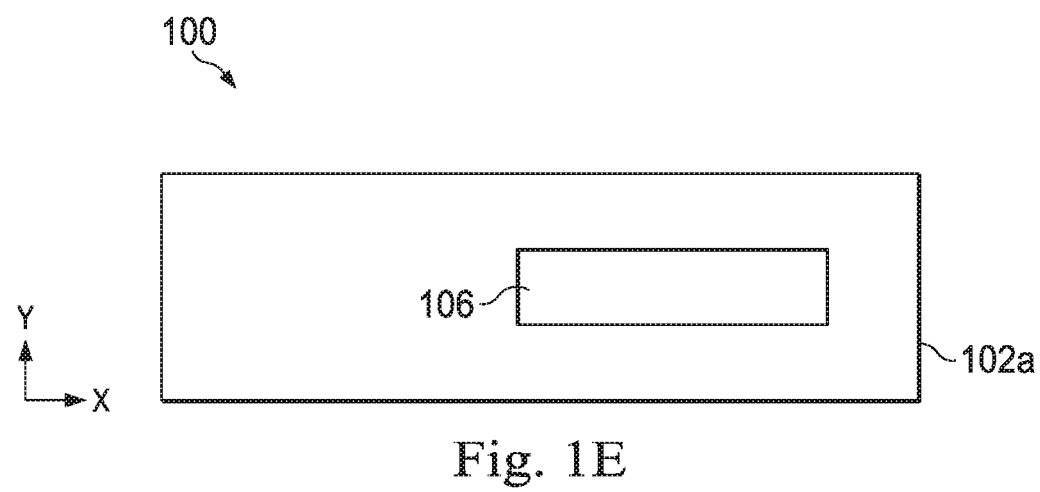
FIG. 1E is a schematic plan view of a top surface of a lower layer of the PCB substrate of FIGS. 1A and 1B, in accordance with some embodiments.

Referring to FIGS. 1A-1E, shown therein is a sensor device 100 constructed according to some aspects of the present disclosure. In a brief overview, the sensor device 100 includes a PCB substrate 102, a sensor chip 110, an optional signal processing chip 116, and an over-molding compound 124 covering the various components. FIGS. 1C-1E shows schematic plan views of some relevant layers of the PCB substrate 102. FIG. 1A is a cross-sectional view of the sensor device 100 along the A-A line of FIG. 1C. FIG. 1B is a cross-sectional view of the sensor device 100 along the B-B line of FIG. 1C. The sensor device 100 is further described below by referring to FIGS. 1A-1E collectively.

The substrate 102 includes two or more layers which are soldered or fused together to form both the mechanical seal and any electrical connectivity. In FIGS. 1A-1B, two layers 102a and 102b are illustrated as part of the substrate 102. In the present embodiment, the substrate 102 is a double-sided PCB (having metal layers on top and bottom surfaces of an insulating material). Any PCB materials (such as ceramic, FR-2, and FR-4) may be used for the substrate 102.

A media channel 105 is provided at least partially in the substrate 102. The media channel 105 is a hollow and continuous channel that is configured for an application medium such as air, a fluid, or a light beam to propagate there-through and to be sensed by the sensor chip 110. The media channel 105 has a horizontal section 106 and two vertical sections 107 and 108. The horizontal section 106 may be formed as a buried slot (e.g., a buried via) inside the PCB substrate 102. For example, the horizontal section 106 may be formed as a recess in the top surface of the PCB layer 102a (FIGS. 1A-1B) or as a recess in the bottom surface of the PCB layer 102b (FIGS. 4A-4B). The horizontal section 106 may have a rectangular, circular, or elliptical shape or other suitable shape in the Y-Z cross-section. The two vertical sections 107 and 108 may be formed as two holes through layers of the substrate 102 that are above the horizontal section 106, and each may have a circular, elliptical, or polygonal shape or other suitable shape in the X-Y plane (see FIGS. 1C and 1D). The media channel 105 may be formed by etching, milling, drilling, or other suitable processes.

Furthermore, the surfaces of the media channel 105 are designed appropriately for the propagation of the application media. For example, when the application medium is air, a gas, or a fluid, the surfaces of the media channel 105 may be properly sealed (e.g., with plated copper or plated gold) and optionally treated with an anti-corrosion material to allow the application medium to flow there-through. For another example, when the application medium is a light beam, the surfaces of the media channel 105 may be made reflective (e.g., with mirror finish) to allow the light beam to reach the bottom surface of the sensor chip 110 through internal reflection. Various other configurations of the media channel 105 and processes of forming the same are contemplated to be within the scope of the present disclosure.

The sensor chip 110 is disposed on the top surface 102' of the substrate 102, and directly on the vertical section 108.

Figure 3:
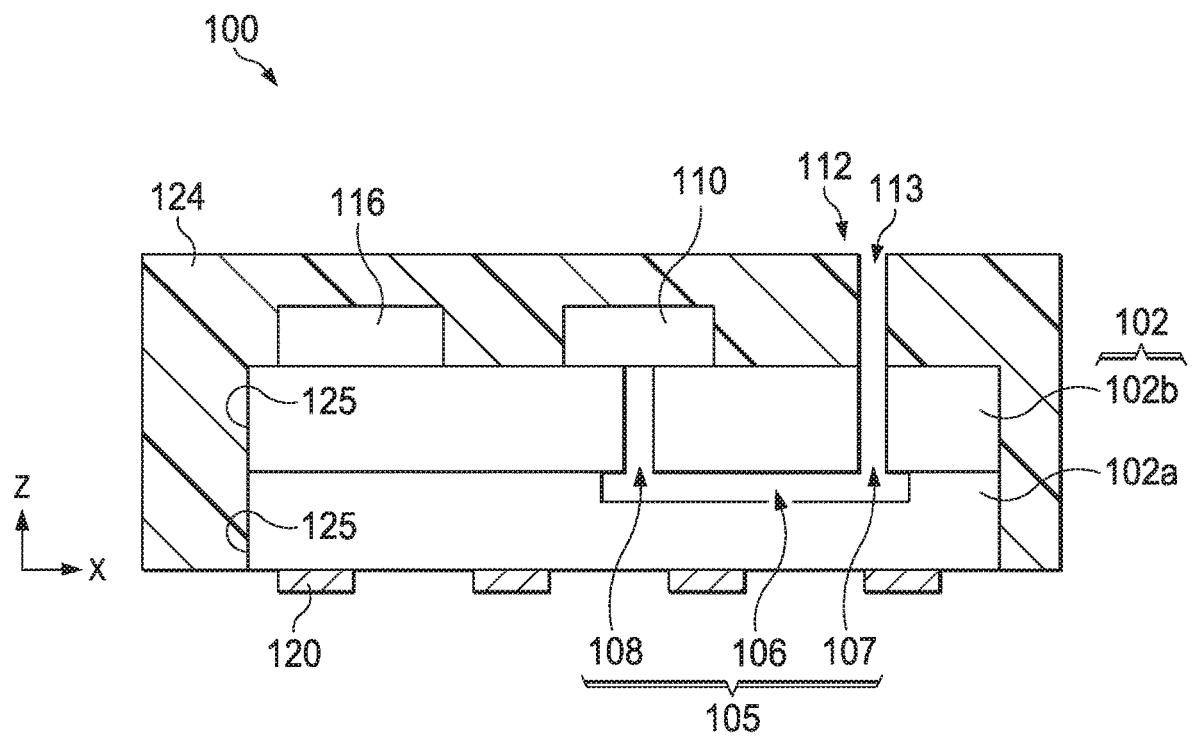
FIG. 3 is a schematic cross-sectional view of an example sensor device, constructed according to some aspects of the present disclosure.

The sensor device 100 further includes a port (or "an access port" or "a tube") 112 having an inlet 113. The port 112 is disposed on the top surface 102' and over the vertical section 107. In the present embodiment, the port 112 has a cylindrical shape with the inlet 113 aligned with the vertical section 107. However, in various embodiments, the port 112 may have any suitable shape, straight or curved, and the inlet 113 may or may not be aligned with the vertical section 107. The application medium (e.g., air, fluid, or light) may propagate through the port 112 and the media channel 105 to reach a sensing area at the bottom surface of the sensor chip 110. The media channel 105 is properly sealed to serve as a passageway for the application medium. In an alternative embodiment, the port 112 may be formed as part of the molding compound 124 instead of a standalone tube, which is shown in FIG. 3 to be further described.

When the application medium is not corrosive to the PCB substrate 102, the media channel 105 may not need special surface treatment. For example, when the sensor device 100 is for pressure measurements and the application medium is air (or a non-corrosive gas), a fiberglass material in the substrate 102 may be sufficient for sealing the media channel 105. To improve the sealing of the media channel 105, the surfaces of the media channel 105 may be covered with copper, plated copper, copper alloy, plated copper alloy, gold, plated gold, or other suitable material.

When the application medium is corrosive to the substrate 102 and/or the sensor chip 110, some anti-corrosion mechanism may be employed in the sensor device 100. For example, the bottom surface of the sensor chip 110 may be covered with a protective membrane. For another example, the surfaces of the media channel 105 may be sprayed, plated, or otherwise formed with a film of anti-corrosion material.

Figure 2:
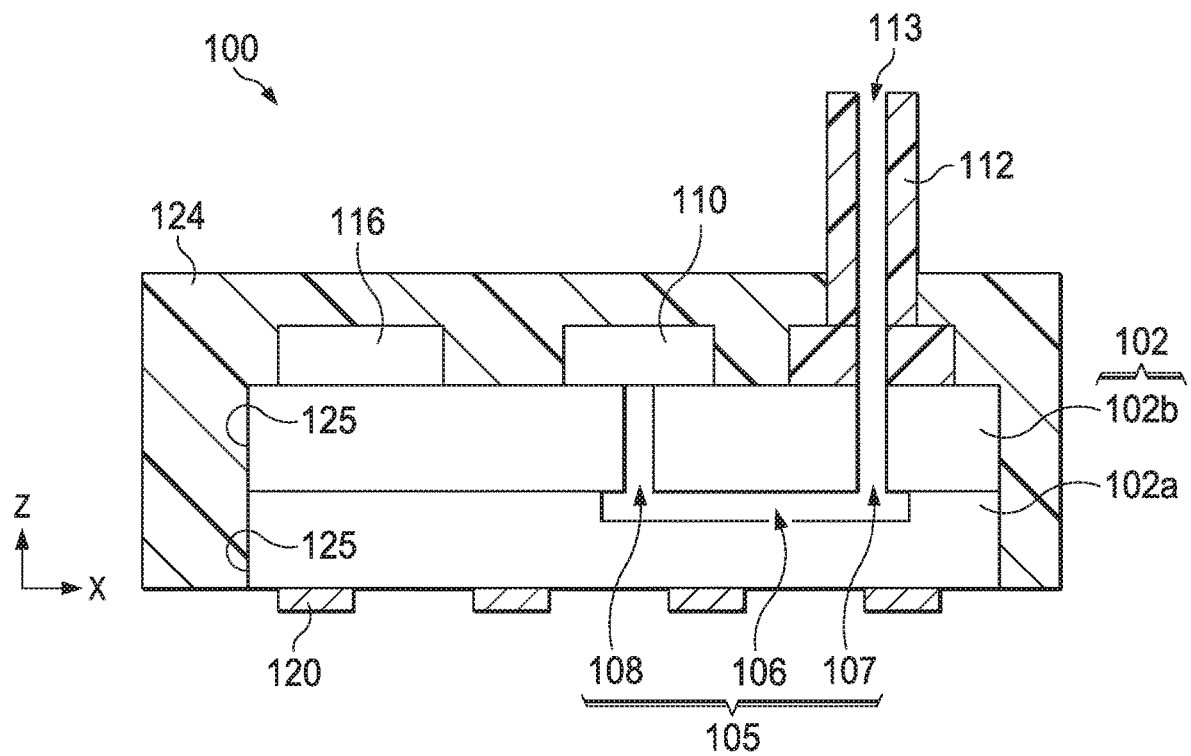
FIG. 2 is a schematic cross-sectional view of an example sensor device, constructed according to some aspects of the present disclosure.

Still referring to FIGS. 1A and 1B, in the present embodiment, the sensor device 100 further includes a second port (or tube) 114 disposed on the top surface of the sensor chip 110. The port 114 has an inlet 115, through which a sensing area at the top surface of the sensor chip 110 is accessed. This is an embodiment where the sensor chip 110 is configured to perform a differential sensing function. In other words, the sensor chip 110 is configured to sense the difference (e.g., air pressure) applied to its top surface (through the port 114) and its bottom surface (through the port 112). In some other embodiments (such as shown in FIG. 2), the sensor chip 110 is configured to perform a single-sided sensing function and the port 114 is therefore not included in the sensor device 100. In various embodiments, the port 114 may have any suitable shape, straight or curved, and the inlet 115 may or may not be aligned with the vertical section 108. Further, the port 114 may also be formed as part of the molding-compound 124 instead of a standalone tube in some embodiment, similar to the port 112 in FIG. 3.

The sensor device 100 further includes a signal processing chip 116 disposed over the substrate 102 in the present embodiment. The signal processing chip 116 may be an application specific integrated circuit (ASIC), a logic device, a processor, a microcontroller, or other suitable electronic device that is configured to control the sensor chip 110 and/or to receive and process signals generated by the sensor chip 110.

The signal processing chip 116 and the sensor chip 110 may be electrically and mechanically connected to the PCB substrate 102 using any suitable mechanisms, depending on the package of the devices 116 and 110. For example, each of the devices 116 and 110 may have a leaded type of package, a Ball Grid Array (BGA) type of package, a Land Grid Array (LGA) type of package, or the like. Referring to FIG. 1C, in the present embodiment, the top surface 102' of the substrate 102 includes a signal processing die attachment area 126 and a sensor die attachment area 128. The signal processing chip 116 and the sensor chip 110 may be attached to the die attachment areas 126 and 128, respectively, using an adhesive or tape (not shown) that may be electrically insulating or conducting. The die attachment areas 126 and 128 may have die pads for the attachment purpose, or may include bumped areas for ensuring the alignment and position of the signal processing chip 116 and the sensor chip 110. The top surface 102' may further include bonding contacts or bump pads (not shown) for electrically bonding (e.g., through bond wires or direct soldering) the signal processing chip 116 and/or the sensor chip 110 to the PCB substrate 102. The PCB substrate 102 may provide electrical connection(s) between the signal processing chip 116 and the sensor chip 110 using conductive traces. The sensor device 100 may also include bond wires directly connecting the devices 116 and 110, in addition to or alternative to the electrical connections through the substrate 102.

The sensor device 100 may further include other active or passive components (not shown), such as resistors and capacitors, mounted on the top surface 102' of the substrate 102. In another embodiment, the sensor device 100 does not include the signal processing chip 116. For example, the sensor device 100 may provide the outputs of the sensor chip 110 to a system board which provides electrical connection between the sensor chip 110 and some signal processing chip.

Still referring to FIGS. 1A and 1B, the sensor device 100 further includes contact pads 120 disposed on the bottom surface 102" of the substrate 102. The contact pads 120 are electrically connected to the sensor chip 110, the signal processing chip 116, and/or other electronic components through conductive routing in the substrate 102. In an application, the sensor device 100 may be integrated into a system by soldering the contact pads 120 onto a system board. Having the contact pads 120 at the bottom surface of the sensor device 100 reduces the footprint of the sensor device 100 and saves the system board area.

The sensor device 100 further includes the molding compound 124. The molding compound 124 may be a plastic, an epoxy, a silica-filled resin, a ceramic, a combination thereof, or other suitable material. The molding compound 124 provides natural sealing of the sensor device 100 and is in mechanical contact with sidewall surfaces 125 and the top surface of the substrate 102, the sensor chip 110, the signal processing chip 116, and any other components on the top surface 102'. The molding compound 124 does not cover the contact pads 120. The molding compound 124 provides protection to the various components of the sensor device 100 from the operating environment. It also provides mechanical strength to the sensor device 100. Particularly, it provides clamping force to the PCB substrate 102, thereby increasing the range of pressure that the sensor device 100 may operate in. In the embodiment as illustrated in FIGS. 1A and 1B, a lower portion of the port 112 is also over-molded by the molding compound 124, thereby becoming a fixture of the sensor device 100. In contrast, the port 114 may be removably attached to the top of the sensor chip 110. In various embodiments, each of the ports 112 and 114, independently, may be fixedly installed (e.g., over-molded by the molding compound 124) in the sensor device 100, or may be removably attached to the sensor device 100 (i.e., it can be plugged and unplugged as needed). Further, as discussed above, each of the ports 112 and 114 may be part of the molding compound 124, e.g., formed by the over-molding process, rather than a standalone piece.

The placement of the various components including the sensor chip 110, the signal processing chip 116, and the ports 112 and 114 on the top surface 102' as shown in FIGS. 1A-1E is exemplary and is not intended to limit the provided subject matter. Similarly, the number of and the placement of the contact pads 120, are also exemplary and do not limit the provided subject matter.

Figure 1F:
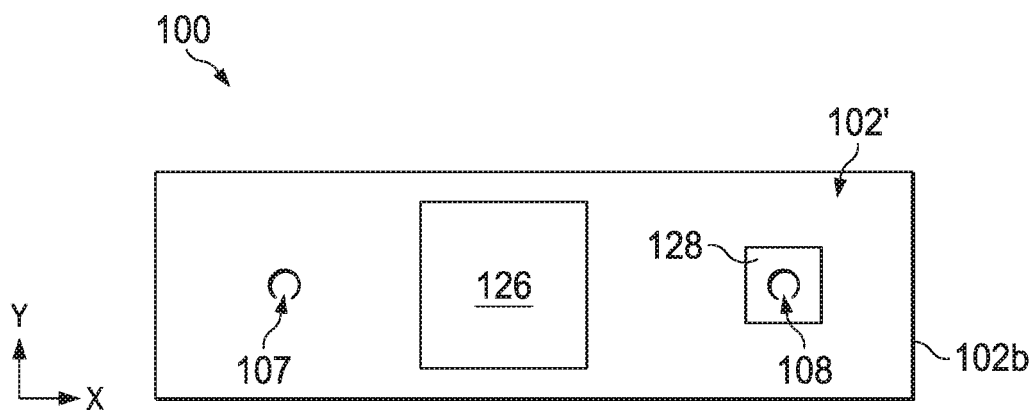
FIG. 1F is a schematic plan view of the top surface of the PCB substrate of FIGS. 1A and 1B, in an alternative embodiment.
Figure 1G:
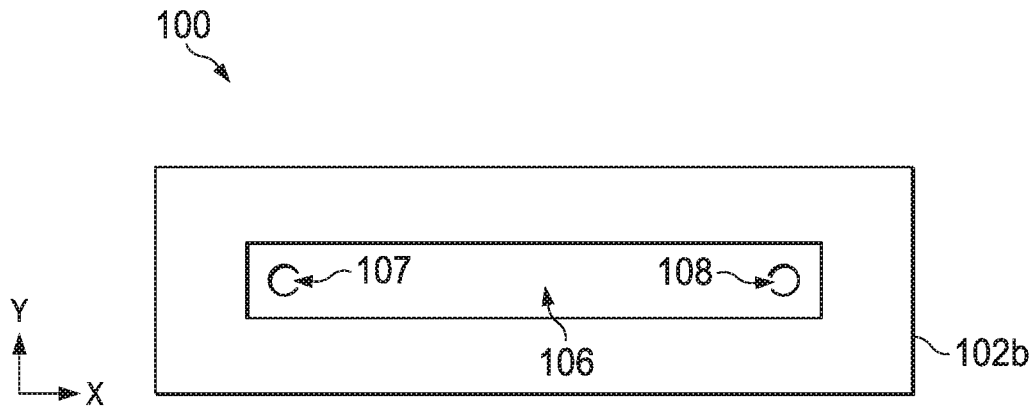
FIG. 1G is a schematic plan view of a bottom surface of an upper layer of the PCB substrate of FIGS. 1A and 1B, in an alternative embodiment.
Figure 1H:
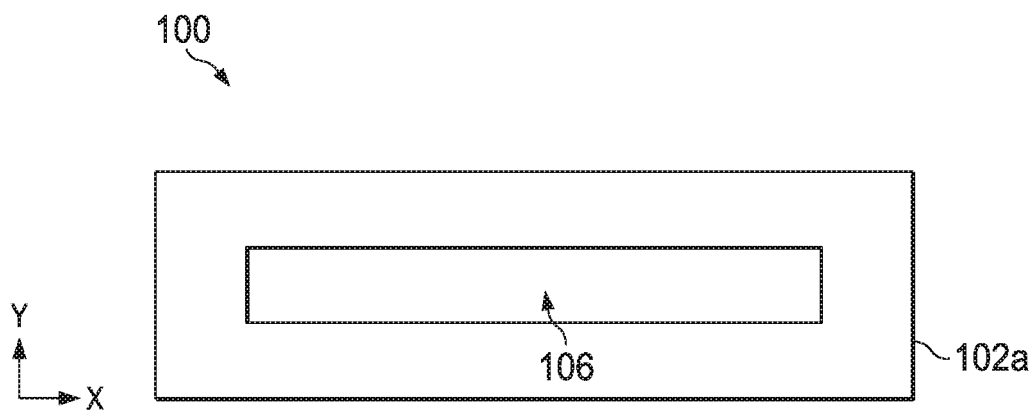
FIG. 1H is a schematic plan view of a top surface of a lower layer of the PCB substrate of FIGS. 1A and 1B, in an alternative embodiment.

FIGS. 1F-1H illustrate another exemplary configuration of the sensor device 100, constructed according to embodiments of the present disclosure. Referring to FIGS. 1F and 1G, the die attachment area 126 (corresponding to the signal processing chip 116) interposes the die attachment area 128 (corresponding to the sensor chip 110) and the vertical section 107 (corresponding to the port 112). The horizontal section 106 straddles underneath the die attachment area 126. In other words, the horizontal section 106 is directly underneath the signal processing chip 116. The configuration shown in FIGS. 1F-1H may make the sensor device 100 very compact. Many other configurations of the sensor device 100 are contemplated to be within the scope of the present disclosure.

FIG. 2 illustrates an embodiment of the device 100 for performing a single-sided sensing function. The port 114 is not included in this sensor device 100. FIG. 3 illustrates another embodiment of the device 100 where the port 112 is merely a part of the molding compound 124. The inlet 113 may be molded by using a pin as part of the over-mold process. FIGS. 4A-4B illustrate cross-sectional views of the sensor device 100 where the media channel 105 is formed in the layer 102b with the horizontal section 106 formed as a recess in the bottom surface of the layer 102b and the vertical sections 107 and 108 formed as holes through the layer 102b. The top surface of the layer 102a serves as a surface of the media channel 105. Other aspects of the sensor device 100 in the FIGS. 4A-4B are the same as those in the FIGS. 1A-1B.

Figure 5:
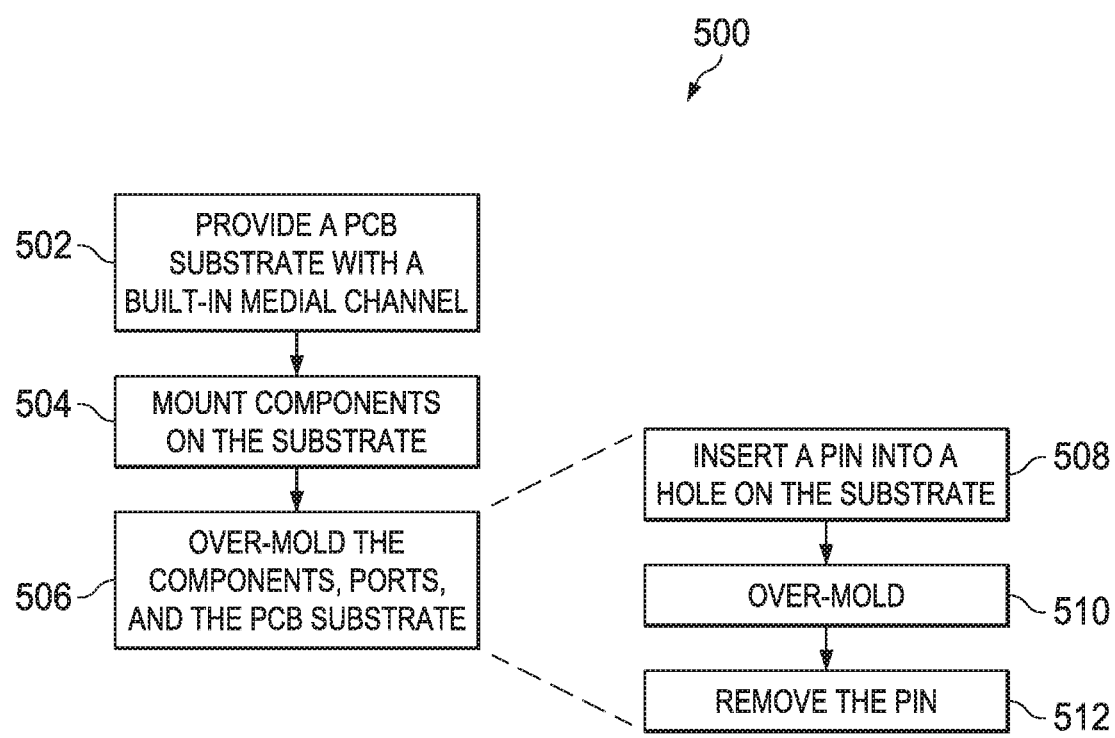
FIG. 5 shows a flow chart of an example method of making a sensor device, in accordance with an embodiment.

FIG. 5 illustrates a flow chart of a method 500 of forming a sensor device, such as the sensor device 100. The method 500 is merely an example, and is not intended to limit the present disclosure beyond what is explicitly recited in the claims. The method 500 includes operations 502, 504, and 506. In an embodiment, the operation 506 includes sub-operations 508, 510, and 512. Additional operations can be provided before, during, and after the method 500, and some operations described can be replaced, eliminated, or moved around for additional embodiments of the method. The method 500 is briefly described below in conjunction with FIGS. 1A-4B.

At operation 502, the method 500 provides (or is provided with) a PCB substrate, such as the PCB substrate 102. The PCB substrate includes a built-in media channel (e.g., the media channel 105 of FIGS. 1A-4B). The media channel includes a horizontal section and two vertical sections. The horizontal section may be built as a buried via or a buried slot in the PCB substrate. The two vertical sections may be built as two holes through the top surface of the PCB substrate and reaching into the horizontal section. The top surface of the PCB substrate may further include bonding contacts, soldering sites, and/or die attachment areas (e.g., die attachment areas 126 and 128 in FIG. 1C or FIG. 1F).

At operation 504, the method 500 mounts (or attaches) various components onto the top surface of the PCB substrate. For example, the method 500 attaches a sensor chip (e.g., the sensor chip 110) onto the top surface of the PCB substrate using adhesive, epoxy, tape, or the like. Particularly, the sensor chip is attached directly above one of the two vertical sections of the media channel. The method 500 may also attach a signal processing chip (e.g., the signal processing chip 116) onto the top surface of the PCB substrate using adhesive, epoxy, tape, or the like. The method 500 may attach additional passive or active electronic components on the top surface of the PCB substrate. Further, the method 500 may make electrical connections between the electronic components and the PCB substrate or among the electronic components. The electrical connections may be in the form of bond wires or direct soldering in various embodiments. The method 500 may also attach one or two ports (or tubes), such as the ports 112 and 114 in FIGS. 1A-1B. Particularly, if needed, one port is attached directly above the other one of the two vertical sections of the media channel that is not covered by the sensor chip, and another port is attached directly above the sensor chip. Alternatively, the method 500 may not attach any of the ports, but rely on the over-mold process (discussed next) to form the inlet 113 and/or 115 (e.g., FIG. 3).

At operation 506, the method 500 over-molds the PCB substrate, the sensor chip, other electronic components (if any), and the optional ports with a molding compound (such as the molding compound 124). The molding compound may be a plastic, an epoxy, a silica-filled resin, a ceramic, a combination thereof, or other suitable material. The molding compound may be applied as a liquid polymer, which is then cured with heat, pressure, ultraviolet radiation, ambient atmosphere, or other suitable mechanisms to form a solid compound.

In an embodiment, the method 500 forms one of the ports (e.g. the port 112) as part of the molding compound instead of a standalone component. To further this embodiment, the method 500 includes sub-operations 508, 510, and 512. At sub-operation 508, the method 500 insert a pin into the vertical section of the media channel that is not covered by the sensor chip. The pin has the shape and size of the inlet 113. At sub-operation 510, the method 500 performs the over-molding process with the molding compound, as discussed above. The pin is over-molded but with one end exposed. At sub-operation 512, the method 500 removes the pin, leaving an inlet 113 in the molding compound 124, such as shown in FIG. 3.

Although not intended to be limiting, one or more embodiments of the present disclosure provide many benefits to sensor devices and the manufacturing processes thereof. For example, sensor devices according to some embodiments of the present disclosure include a sensor chip and various other active and passive components (if any) on a top surface of a PCB substrate and further includes a molding compound covering and in mechanical contact with the sensor chip, the various other active and passive components, and sidewall surface and the top surface of the PCB substrate. A media channel is provided in the PCB substrate with its surfaces properly sealed and treated for application media. The molding compound not only protects the various components, but also increases the mechanical strength of the sensor device. Sensor devices according to the present disclosure can be made into a very compact package.

In one exemplary aspect, the present disclosure is directed to a sensor device. The sensor device includes a printed circuit board (PCB) substrate having a top surface, a bottom surface, a slot between the top and bottom surfaces, and two holes through the top surface and reaching into the slot. The sensor device further includes a sensor chip mounted on the top surface of the PCB substrate and above one of the two holes and a molding compound covering the sensor chip and sidewall surfaces and the top surface of the PCB substrate.

In another exemplary aspect, the present disclosure is directed to a sensor device. The sensor device includes a printed circuit board (PCB) substrate having a top surface, a bottom surface, a buried via between the top and bottom surfaces, and two holes through the top surface and reaching into the buried via thereby forming a channel for a medium to pass between the two holes. The sensor device further includes a sensor chip mounted on the top surface of the PCB substrate and on one of the two holes, a molding compound covering the sensor chip and sidewalls and the top surface of the PCB substrate, and a port on the other one of the two holes.

In yet another exemplary aspect, the present disclosure is directed to a method for making a sensor device. The method is performed with respect to a printed circuit board (PCB) substrate comprising a top surface, a bottom surface, a buried slot between the top and bottom surfaces, and two holes through the top surface and reaching into the buried slot. The method includes mounting a sensor chip onto the top surface of the PCB substrate and directly above one of the two holes and over-molding the sensor chip and the PCB substrate with a molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method performed with respect to a printed circuit board (PCB) substrate comprising a top surface, a bottom surface, a buried slot between the top and bottom surfaces, a plurality of holes through the top surface and reaching into the buried slot, the method comprising:
   mounting a sensor chip onto the top surface of the PCB substrate and directly above a first hole of the plurality of holes; and
   disposing a first port directly over a second hole of the plurality of holes; and
   over-molding the sensor chip and the PCB substrate with a molding compound.

2. The method of claim 1, wherein disposing the first port comprises:
   before the over-molding of the sensor chip and the PCB substrate, attaching the first port to the top surface of the PCB substrate directly above the second hole, wherein the over-molding of the sensor chip and the PCB substrate includes over-molding the first port, the sensor chip, and the PCB substrate.

3. The method of claim 1, further comprising, before the over-molding of the sensor chip and the PCB substrate:
   mounting a signal processing chip onto the top surface of the PCB substrate, wherein the over-molding of the sensor chip and the PCB substrate includes over-molding the signal processing chip, the sensor chip, and the PCB substrate.

4. The method of claim 1, wherein disposing the first port comprises:
before the over-molding of the sensor chip and the PCB substrate, inserting a pin into the second hole; and
after the over-molding of the sensor chip and the PCB substrate, removing the pin thereby forming the first port through the molding compound and connected to the second hole.

5. The method of claim 1, further comprising:
disposing a second port above sensor chip;
wherein the over-molding of the sensor chip and the PCB substrate includes over-molding the sensor chip, the PCB substrate, and the second port.

6. The method of claim 1, further comprising:
treating the buried slot with an anti-corrosion material.

7. The method of claim 1, further comprising:
plating the buried slot with copper or gold.

8. The method of claim 1, further comprising:
forming a plurality of contact pads on the bottom surface of the PCB substrate.

9. The method of claim 1, wherein the sensor chip comprises an item selected from the list consisting of:
an air pressure sensor;
a light sensor; and
an acoustic sensor.

10. The method of claim 1, wherein the over-molding includes:
applying the molding compound as a liquid polymer; and
curing the liquid polymer with heat, pressure, ultraviolet radiation, ambient atmosphere, or a combination thereof to form a solid compound.

11. A method of forming a sensor device, the method comprising:
forming a plurality of holes in a top surface of a printed circuit board (PCB) substrate, wherein the PCB substrate includes a bottom surface and a slot between the top and bottom surfaces, further wherein the plurality of holes reach into the slot;
mounting a signal processing chip on the top surface of the PCB substrate;
mounting a sensor chip directly over a first hole of the plurality of holes, wherein the sensor chip is configured to communicate electrical signals to the signal processing chip;
disposing a first port directly over a second hole of the plurality of holes, the first port, the first hole, the slot and the second hole forming a channel for propagation of a medium to be sensed by the sensor chip; and
over-molding the sensor chip, the signal processing chip, and the PCB substrate.

12. The method of claim 11, wherein disposing the first port comprises:
before the over-molding, attaching the first port to the top surface of the PCB substrate directly above the second hole, wherein the over-molding includes over-molding the first port, the sensor chip, and the PCB substrate.

13. The method of claim 11, wherein disposing the first port comprises:
before the over-molding, inserting a pin into the second hole; and
after the over-molding, removing the pin thereby forming the first port through molding compound and connected to the second hole.

14. The method of claim 11, further comprising:
disposing a second port above sensor chip;
wherein the over-molding includes over-molding the second port.

15. The method of claim 14, wherein the sensor chip comprises a differential sensor configured to sense propagation of the medium by the second port.

16. The method of claim 11, further comprising:
treating the slot with an anti-corrosion material.

17. The method of claim 11, further comprising:
plating the slot with copper or gold.

18. The method of claim 11, further comprising:
forming a plurality of contact pads on the bottom surface of the PCB substrate, the contact pads being in electrical communication with the signal processing chip.

19. The method of claim 11, wherein the sensor chip comprises an item selected from the list consisting of:
an air pressure sensor;
a light sensor; and
an acoustic sensor.

20. The method of claim 11, wherein the over-molding includes:
applying a molding compound as a liquid polymer; and
curing the liquid polymer with heat, pressure, ultraviolet radiation, ambient atmosphere, or a combination thereof to form a solid compound.

* * * * *